United States Patent
Matsumoto et al.

(10) Patent No.: US 10,257,457 B2
(45) Date of Patent: Apr. 9, 2019

(54) SOLID-STATE IMAGING DEVICE

(71) Applicant: Renesas Electronics Corporation, Tokyo (JP)

(72) Inventors: Osamu Matsumoto, Tokyo (JP); Fukashi Morishita, Tokyo (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 10 days.

(21) Appl. No.: 15/797,085

(22) Filed: Oct. 30, 2017

(65) Prior Publication Data

US 2018/0152656 A1    May 31, 2018

(30) Foreign Application Priority Data

Nov. 29, 2016 (JP) .................................. 2016-231717

(51) Int. Cl.
*H04N 5/3745* (2011.01)
*H04N 5/378* (2011.01)
(Continued)

(52) U.S. Cl.
CPC .............. *H04N 5/378* (2013.01); *H03M 1/46* (2013.01); *H03M 1/682* (2013.01); *H03M 1/765* (2013.01);
(Continued)

(58) Field of Classification Search
CPC ... H04N 5/378; H04N 5/37455; H03M 1/765; H03M 1/682; H03M 1/46; H03M 1/466; H03M 1/123
See application file for complete search history.

(56) References Cited

U.S. PATENT DOCUMENTS 9,041,580 B2    5/2015  Okura et al.
2014/0362273 A1*  12/2014  Okura ................... H03M 1/468
                                                         348/308
(Continued)

FOREIGN PATENT DOCUMENTS

JP        2014-241492 A      12/2014

*Primary Examiner* — Shahbaz Nazrul
(74) *Attorney, Agent, or Firm* — Sughrue Mion, PLLC

(57) ABSTRACT

Provided is a solid-state imaging device capable of increasing the speed of an A/D converter. The solid-state imaging device includes a successive approximation A/D converter that performs A/D conversion on an analog pixel signal. The successive approximation A/D converter includes a D/A converter, a comparator, and a successive approximation register. The D/A converter converts a digital reference signal to an analog reference signal. The successive approximation register operates based on the result of comparison by the comparator to generate the digital reference signal in such a manner that the analog reference signal approximates the analog pixel signal. The D/A converter includes a split capacitor, first capacitors, second capacitors, a switch array, a third capacitor, and a multiplexer. The first capacitors each have a first electrode coupled to the output node. The second capacitors are coupled to a second electrode of the split capacitor. The switch array is coupled to a second electrode of each of the first and second capacitors and is adapted to generate the analog reference signal at the output node by selectively applying a first reference voltage. The third capacitor is coupled to the second electrode of the split capacitor. The multiplexer is coupled to a second electrode of the third capacitor and is adapted to generate the analog reference signal at the output node by selectively applying a second reference voltage.

18 Claims, 15 Drawing Sheets

(51) Int. Cl.
  *H03M 1/76* (2006.01)
  *H03M 1/68* (2006.01)
  *H03M 1/46* (2006.01)
  *H03M 1/12* (2006.01)

(52) U.S. Cl.
  CPC ............ *H03M 1/123* (2013.01); *H03M 1/466* (2013.01); *H04N 5/37455* (2013.01)

(56) References Cited

U.S. PATENT DOCUMENTS

| | | | |
|---|---|---|---|
| 2016/0352347 A1* | 12/2016 | Fernando | H03M 1/1009 |
| 2018/0013441 A1* | 1/2018 | Haneda | H03M 1/06 |
| 2018/0097535 A1* | 4/2018 | Gordon | H04B 1/16 |
| 2018/0183456 A1* | 6/2018 | Lee | H03M 1/0626 |
| 2018/0254779 A1* | 9/2018 | Omran | G01D 5/24 |
| 2018/0269893 A1* | 9/2018 | Chang | H03M 1/0682 |

* cited by examiner

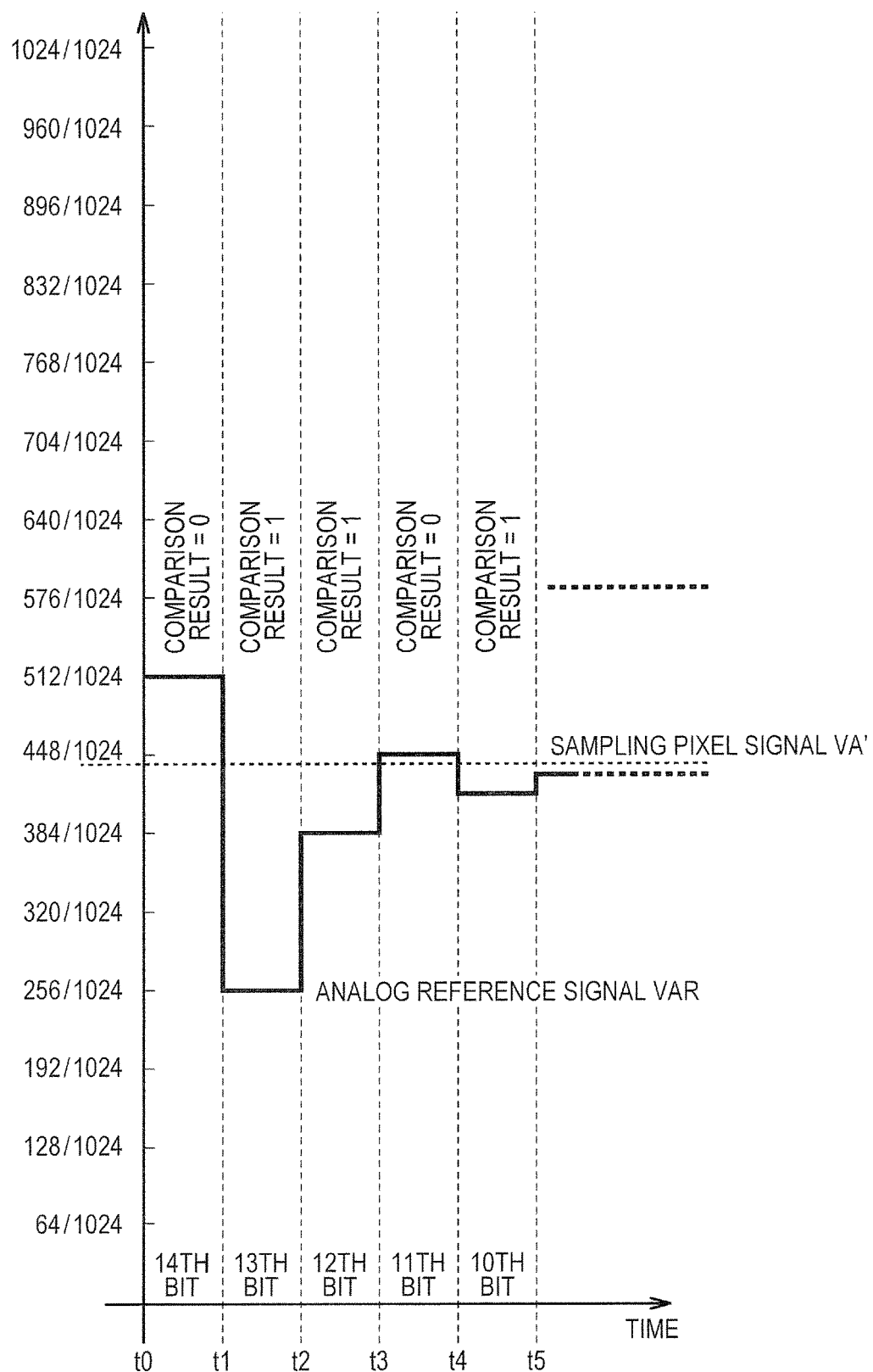

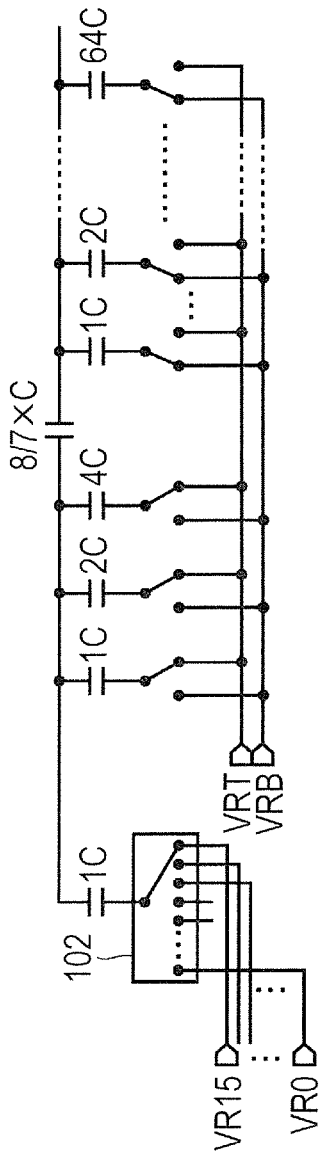
FIG. 7A  D/A CONVERTER WHEN DIGITAL REFERENCE SIGNAL DR IS 127
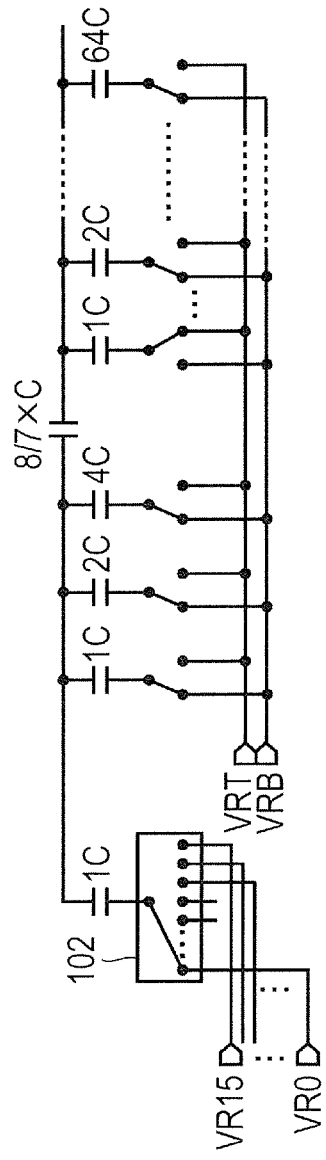
FIG. 7B  D/A CONVERTER WHEN DIGITAL REFERENCE SIGNAL DR IS 128

SOLID-STATE IMAGING DEVICE

CROSS-REFERENCE TO RELATED APPLICATIONS

The disclosure of Japanese Patent Application No. 2016-231717 filed on Nov. 29, 2016 including the specification, drawings, and abstract is incorporated herein by reference in its entirety.

BACKGROUND

The present disclosure relates to a solid-state imaging device. For example, the present disclosure relates to a solid-state imaging device having a successive approximation analog-to-digital converter.

A digital camera captures an image of an object with a lens and forms an optical image on a solid-state imaging device. The solid-state imaging device may be roughly divided into two types, namely, a CCD (Charge Coupled Device) image sensor and a CMOS (Complementary Metal Oxide Semiconductor) image sensor. From the perspective of high camera performance, the CMOS image sensor has attracted attention because an image processing CMOS circuit can easily be incorporated as a peripheral circuit. The CMOS image sensor is available in two types, namely, an analog image sensor and a digital image sensor. Each of these types has advantages and disadvantages. However, the digital image sensor has higher expectations in terms of data processing speed.

The digital image sensor includes an analog-to-digital converter (A/D converter) that is provided for each column of a pixel array. Japanese Unexamined Patent Application Publication No. 2014-241492 discloses a digital image sensor that uses a successive approximation A/D converter. This digital image sensor includes a pixel array having plural pixels arranged in rows and columns, and outputs an analog pixel signal to a column signal line for each column.

The successive approximation A/D converter is provided for each column, and includes an S/H (Sample-and-Hold) circuit, a D/A (Digital-to-Analog) converter, a comparator, and a successive approximation register. The successive approximation A/D converter compares the voltage of the analog pixel signal with the output voltage of the D/A converter. In accordance with the result of the comparison, the successive approximation register exercises binary search control so that the output voltage of the D/A converter approximates the analog pixel signal. When the output signal of the D/A converter approximates the analog pixel signal, the successive approximation A/D converter outputs a control code of the successive approximation register as a digital pixel signal.

Further, the area of the D/A converter is reduced by performing two-step A/D conversion with plural sub-range regions. In the two-step A/D conversion, coarse A/D conversion is executed on the sub-range regions by using a binary search tree, and remaining fine A/D conversion is executed on a selected sub-range region by performing general successive approximation with a capacitor array that is binary-weighted by using a reference voltage given to the selected sub-range region.

SUMMARY

Meanwhile, according to a method described in Japanese Unexamined Patent Application Publication No. 2014-241492, a reference voltage generated by resistance division is applied to plural capacitors in the capacitor array. Therefore, when the reference voltage is used to charge or discharge the capacitors, a significant amount of time is required in accordance with a time constant based on the resistance components of resistors and the capacitance components of capacitors. That is to say, it is demanded that the A/D converter increase its speed because a certain amount of settling time is required for D/A conversion output voltage.

The present disclosure has been made in view of the above circumstances and provides a solid-state imaging device capable of increasing the speed of an A/D converter.

Other problems and novel features will become apparent from the following description and from the accompanying drawings.

According to an aspect of the present disclosure, there is provided a solid-state imaging device including a pixel circuit, a first reference voltage generation circuit, a second reference voltage generation circuit, and a successive approximation A/D converter. The pixel circuit outputs an analog pixel signal having a voltage based on the amount of incident light. The first reference voltage generation circuit generates two types of first reference voltage, namely, a first reference voltage for a first voltage and a first reference voltage for a second voltage lower than the first voltage. The second reference voltage generation circuit generates N types of second reference voltage based on resistance division. The successive approximation A/D converter performs A/D conversion on the analog pixel signal based on the first and second reference voltages. The successive approximation A/D converter includes a D/A converter, a comparator, and a successive approximation register. The D/A converter converts a digital reference signal to an analog reference signal. The comparator compares the magnitude of the analog pixel signal with the magnitude of the analog reference signal and outputs a signal indicative of the result of comparison. The successive approximation register operates based on the result of comparison by the comparator in order to generate the digital reference signal in such a manner that the analog reference signal approximates the analog pixel signal. The D/A converter includes a split capacitor, plural first capacitors, plural second capacitors, a switch array, a third capacitor, and a multiplexer. The split capacitor has one electrode coupled to an output node. The first capacitors each have one electrode coupled to the output node capacitors. The second capacitors are coupled to the other electrode of the split capacitor. The switch array is coupled to the other electrode of each of the first and second capacitors and is adapted to generate the analog reference signal at the output node by selectively applying the first reference voltage. The third capacitor is coupled to the other electrode of the split capacitor. The multiplexer is coupled to the other electrode of the third capacitor and is adapted to generate the analog reference signal at the output node by selectively applying the second reference voltage.

According to an aspect of the present disclosure, the solid-state imaging device is capable of performing high-speed A/D conversion by reducing the settling time of the output voltage of a D/A converter.

BRIEF DESCRIPTION OF THE DRAWINGS

FIG. 4 is a timing diagram illustrating an operation of the successive approximation A/D converter;

FIGS. 7A and 7B are diagrams illustrating examples of wiring between reference voltages and a capacitor array of a D/A converter;

DETAILED DESCRIPTION

Figure 1:
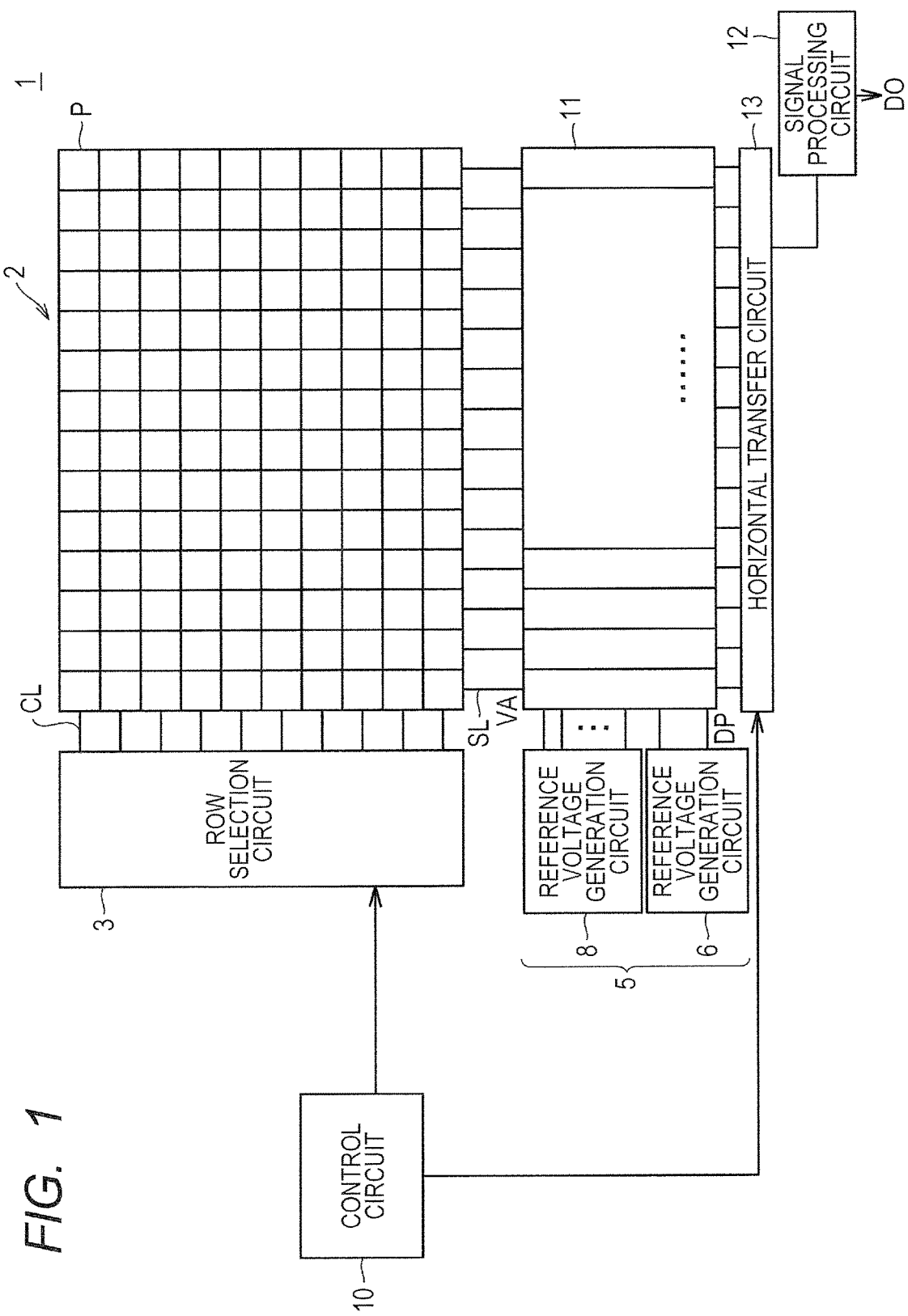
FIG. 1 is a diagram illustrating a configuration of a solid-state imaging device according to a first embodiment of the present disclosure.

Embodiments of the present disclosure will now be described with reference to the accompanying drawings. Identical or equivalent elements in the drawings are designated by the same reference signs and will not be redundantly described.

First Embodiment

FIG. 1 is a diagram illustrating a configuration of a solid-state imaging device 1 according to a first embodiment of the present disclosure.

The solid-state imaging device 1 according to the first embodiment is a semiconductor device formed on a semiconductor substrate. As illustrated in FIG. 1, the solid-state imaging device 1 includes a pixel array 2, a row selection circuit 3, and a control circuit 10.

The pixel array 2 includes plural pixel circuits P, plural control lines CL, and plural signal lines SL. The pixel circuits P are arranged in rows and columns. The control lines CL are respectively provided for plural rows. The signal lines SL are respectively provided for plural columns. Each pixel circuit P outputs a sampling pixel signal VA' having a voltage based on the amount of incident light. Each pixel circuit P is coupled to the control line CL for the associated row and coupled to the signal line SL for the associated column. The control lines CL are coupled to the row selection circuit 3.

The row selection circuit 3, which is controlled by the control circuit 10, sequentially selects the rows one at a time, and sets the control line CL for the selected row to an activation level. When the associated control line CL is set to the activation level, each pixel circuit P is activated to output the sampling pixel signal VA', which has a voltage based on the amount of incident light, to the associated signal line SL. The control circuit 10 provides overall control of the solid-state imaging device 1.

The solid-state imaging device 1 further includes a reference voltage generation circuit group 5, plural successive approximation A/D converters 11, a horizontal transfer circuit 13, and a signal processing circuit 12.

The reference voltage generation circuit group 5 includes a reference voltage generation circuit 6 (first reference voltage generation circuit) and a reference voltage generation circuit 8 (second reference voltage generation circuit).

The reference voltage generation circuit 6 generates reference voltages VRT, VRB (<VRT).

The reference voltage generation circuit 8 generates sixteen reference voltages VR0-VR15 (second reference voltages).

The reference voltages VR0-VR15 are in order from the lowest to the highest. The difference between each reference voltage is a predetermined value. One reference voltage differs by a predetermined value from the next reference voltage. The reference voltages VR0-VR15 are given to each of the successive approximation A/D converters 11. The successive approximation A/D converters 11 are respectively coupled to the signal lines SL.

Each successive approximation A/D converter 11 operates in compliance with a control instruction from the control circuit 10 to receive the sampling pixel signal VA', which is outputted to the associated signal line SL from the pixel circuit P activated by the row selection circuit 3, and convert the received sampling pixel signal VA' to a 14-bit digital pixel signal DP.

More specifically, each successive approximation A/D converter 11 performs A/D conversion (high-order bit A/D conversion) including a number of normal comparison operations (e.g., ten normal comparison operations) based on the reference voltages VRT, VRB.

Further, each successive approximation A/D converter 11 performs A/D conversion (low-order bit A/D conversion) including a number of normal comparison operations (e.g., four normal comparison operations) based on the reference voltages VR0-VR15.

When a single normal comparison operation is performed, a 1-bit data signal is generated. Accordingly, a 14-bit data signal is generated so as to convert the sampling pixel signal VA' to a digital pixel signal DP including a 14-bit data signal.

The horizontal transfer circuit 13 temporarily stores plural digital pixel signals DP for one row, which are given from the plural successive approximation A/D converters 11, and then sequentially transfers the stored digital pixel signals DP, one at a time, to the signal processing circuit 12.

The signal processing circuit 12 generates a 14-bit digital pixel signal DO based on the 14-bit digital pixel signal DP, and outputs the generated digital pixel signal DO to the outside.

Figure 2:
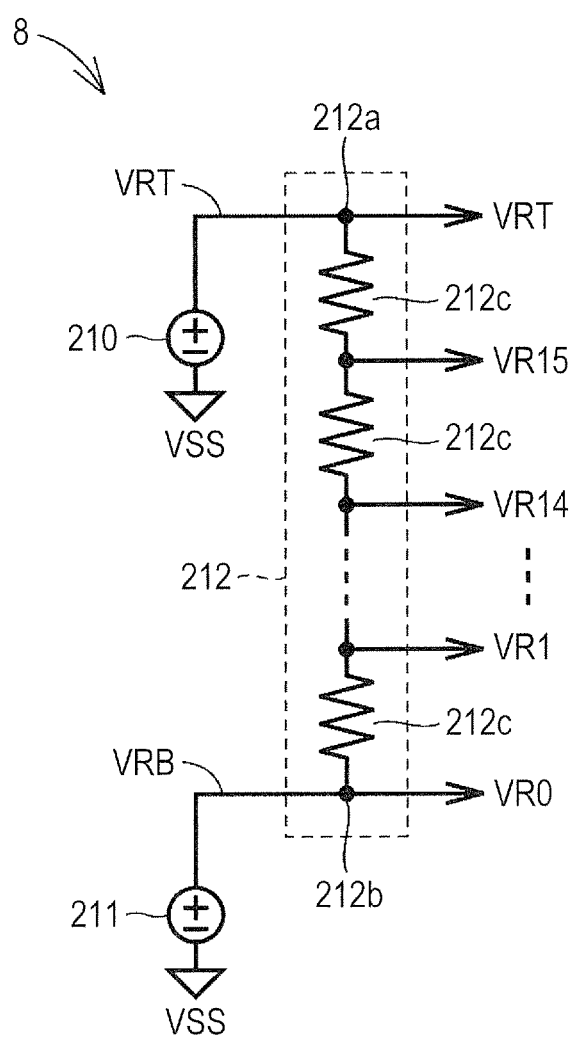
FIG. 2 is a circuit diagram illustrating a configuration of a reference voltage generation circuit.

FIG. 2 is a circuit diagram illustrating a configuration of the reference voltage generation circuit 8.

Referring to FIG. 2, the reference voltage generation circuit 8 includes constant voltage sources 210, 211 and a resistor ladder 212. The positive electrode of the constant voltage source 210 is coupled to one terminal 212a of the resistor ladder 212, and the negative electrode of the constant voltage source 210 is coupled to a line of a ground voltage VSS. The positive electrode of the constant voltage source 211 is coupled to the other terminal 212b of the resistor ladder 212, and the negative electrode of the constant voltage source 211 is coupled to the line of the ground voltage VSS. The constant voltage sources 201, 211 respectively output the reference voltages VRT, VRB. It should be noted that VRT>VRB.

In the present embodiment, the reference voltage VRB is equal to the reference voltage VR0.

The resistor ladder 212 includes fifteen resistive elements 212c that are serially coupled between the terminals 212a, 212b, and generates the reference voltages VR1-VR15 by dividing the voltage between the reference voltage VRT and the reference voltage VR0. The reference voltages VR1-VR15 are obtained by equally dividing the voltage between the reference voltages VR0, VRT.

The reference voltage generation circuit 6 includes the constant voltage sources 210, 211 and outputs the reference voltages VRT, VRB.

Figure 3:
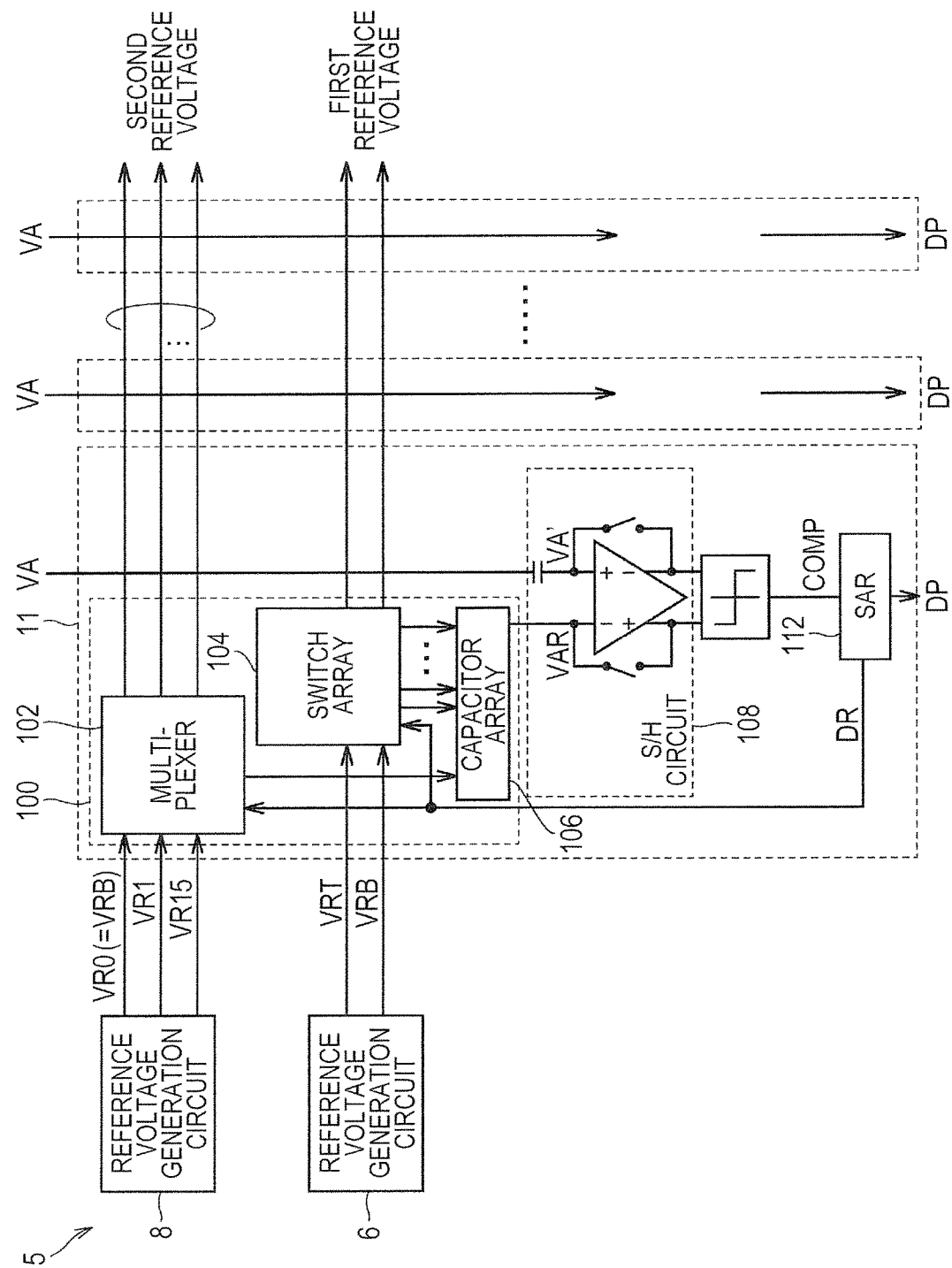
FIG. 3 is a block diagram illustrating a configuration of a successive approximation A/D converter.

FIG. 3 is a block diagram illustrating a configuration of a successive approximation A/D converter 11.

As illustrated in FIG. 3, the successive approximation A/D converter 11 includes a D/A converter 100, an S/H circuit 108, a comparator 110, and a successive approximation register (SAR) 112.

The D/A converter 100 includes a multiplexer 102, a switch array 104, and a capacitor array 106, and is controlled in compliance with a control instruction from the control circuit 10.

The reference voltages VR0-VR15 generated by the reference voltage generation circuit 8 are supplied to the multiplexer 102 of each D/A converter 100.

The reference voltages VRT, VRB generated by the reference voltage generation circuit 6 are supplied to the switch array 104 of each D/A converter 100.

When high-order bit A/D conversion is to be performed, the switch array 104 selects either one of the reference voltages VRT, VRB in accordance with a digital reference signal DR from the successive approximation register 112, and gives the selected reference voltage to the capacitor array 106.

When low-order bit A/D conversion is to be performed, the multiplexer 102 selects one of the reference voltages VR0-VR15 in accordance with the digital reference signal DR from the successive approximation register 112, and gives the selected reference voltage to the capacitor array 106.

When high-order bit A/D conversion and low-order bit A/D conversion are to be performed, the capacitor array 106 generates an analog reference signal VAR based on the reference voltages that are applied from the reference voltage generation circuits 6, 8 in accordance with the digital reference signal DR.

The S/H circuit 108, which is controlled in compliance with a control instruction from the control circuit 10, samples the sampling pixel signal VA' from the associated signal line SL at predetermined intervals, and stores the sampled signal as the sampling pixel signal VA'.

The comparator 110 compares the magnitude of the voltage of the sampling pixel signal VA' with the magnitude of the voltage of the analog reference signal VAR, and outputs an output signal COMP indicative of the result of comparison.

The successive approximation register 112, which is controlled in compliance with a control instruction from the control circuit 10, operates based on the output signal COMP of the comparator 110 in order to generate the digital reference signal DR in such a manner that the voltage of the analog reference signal VAR approximates the voltage of the sampling pixel signal VA'.

When the voltage of the analog reference signal VAR approximates the voltage of the sampling pixel signal VA', the digital reference signal DR acts as the 14-bit digital pixel signal DP.

FIG. 4 is a timing diagram illustrating an operation of the successive approximation A/D converter 11.

Referring to FIG. 4, the successive approximation A/D converter 11 sequentially performs high-order bit A/D conversion of ten bits (bits 14 to 5) at time t0, time t1, time t2, and so on, and then performs low-order bit A/D conversion of four bits (bits 4 to 1).

The present embodiment is described with reference to a case where the high-order bit A/D conversion is performed.

In the high-order bit A/D conversion, the analog reference signal VAR is generated by using the reference voltages VRT, VRB, and then the voltage of the generated analog reference signal VAR is compared with the voltage of the sampling pixel signal VA' to perform successive approximation by using a binary search tree.

In the high-order bit A/D conversion, one out of 1024 divided sub-range regions is selected as a sub-range region including the sampling pixel signal VA'.

More specifically, the present embodiment is described with reference to a case where the voltage of the sampling pixel signal VA' is included in the 448th and lower sub-ranges out of the 1024 divided sub-range regions.

When the 14th bit is determined (between time t0 and time t1), the analog reference signal VAR for the 512nd sub-range region, which is an intermediate sub-range region out of the 1024 divided sub-range regions, is generated by using the binary search tree, and the magnitude of the generated analog reference signal VAR is compared with the magnitude of the sampling pixel signal VA'. Here, VAR >VA'. Therefore, the 14th bit data signal is "0".

As the 14th bit data signal (output signal COMP) is "0", the binary search tree is used to generate the analog reference signal VAR for the 256th sub-range region when the 13th bit is determined (between time t1 and time t2). The magnitude of the analog reference signal VAR for the 256th sub-range region is compared with the magnitude of the sampling pixel signal VA'. Here, VAR <VA'. Therefore, the 13th bit data signal is "1".

As the 13th bit data signal (signal COMP) is "1", the binary search tree is used to generate the analog reference signal VAR for the 384th sub-range region when the 12th bit is determined (between time t2 and time t3). The magnitude of the analog reference signal VAR for the 384th sub-range region is compared with the magnitude of the sampling pixel signal VA'. Here, VAR <VA'. Therefore, the 12th bit data signal is "1".

As the 12th bit data signal is "1", the binary search tree is used to generate the analog reference signal VAR for the 448th sub-range region when the 11th bit is determined (between time t3 and time t4). The magnitude of the analog reference signal VAR for the 448th sub-range region is compared with the magnitude of the sampling pixel signal VA'. Here, VAR >VA'. Therefore, the 11th bit data signal is "0".

The rest is basically the same as described above. The 14th to 5th bits can be determined by using the binary search tree to select one out of the 1024 divided sub-range regions.

Figure 5A:
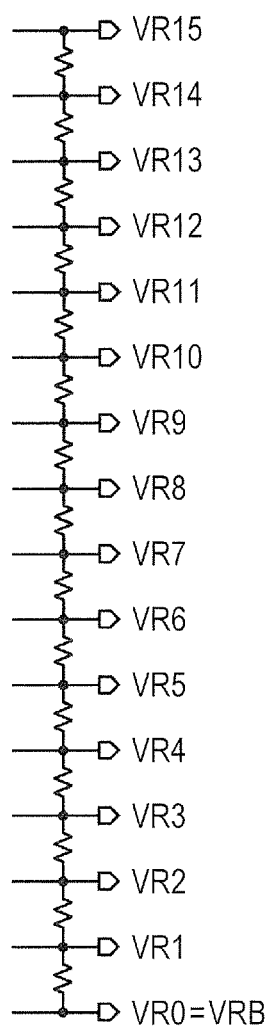
FIGS. 5A and 5B are diagrams illustrating the determination of four low-order bits of the successive approximation A/D converter.
Figure 5B:
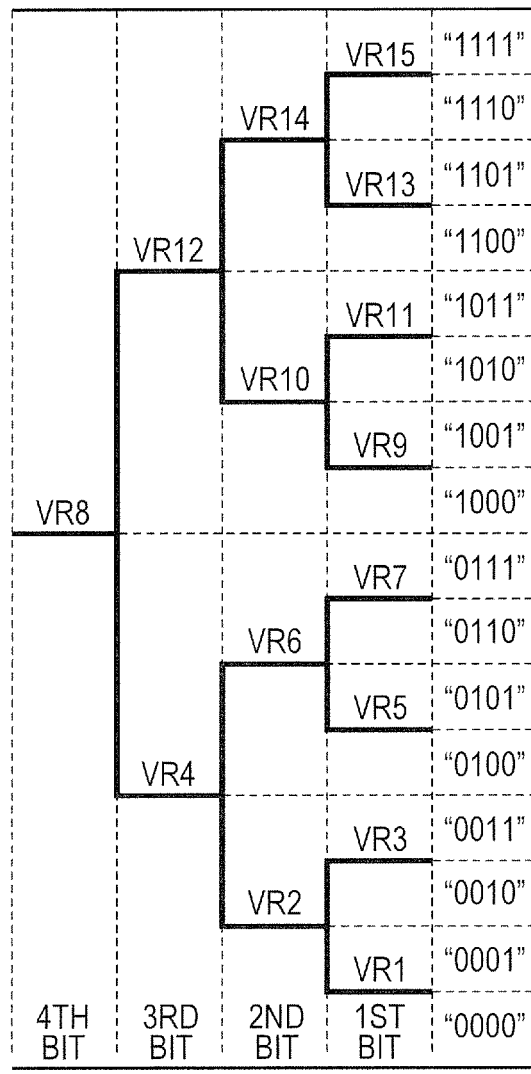

FIGS. 5A and 5B are diagrams illustrating the determination of four low-order bits of the successive approximation A/D converter 11.

As illustrated in FIG. 5A, the reference voltages VR0-VR15 are used for the determination of the four low-order bits.

As illustrated in FIG. 5B, for the sampling pixel signal VA' in a selected sub-range region, one out of sixteen divided low-order sub-range regions is selected by using the binary search tree.

For the determination of the 4th bit, the binary search tree uses the reference voltage VR8 to compare the magnitude of the analog reference signal VAR based on the reference voltage VR8 with the magnitude of the sampling pixel signal VA'.

Based on the result of the above comparison, the binary search tree uses the reference voltage VR4 or the reference voltage VR12 for the determination of the 3rd bit. The 4th to 1st bits can be determined by making the similar determination four times.

Figure 6:
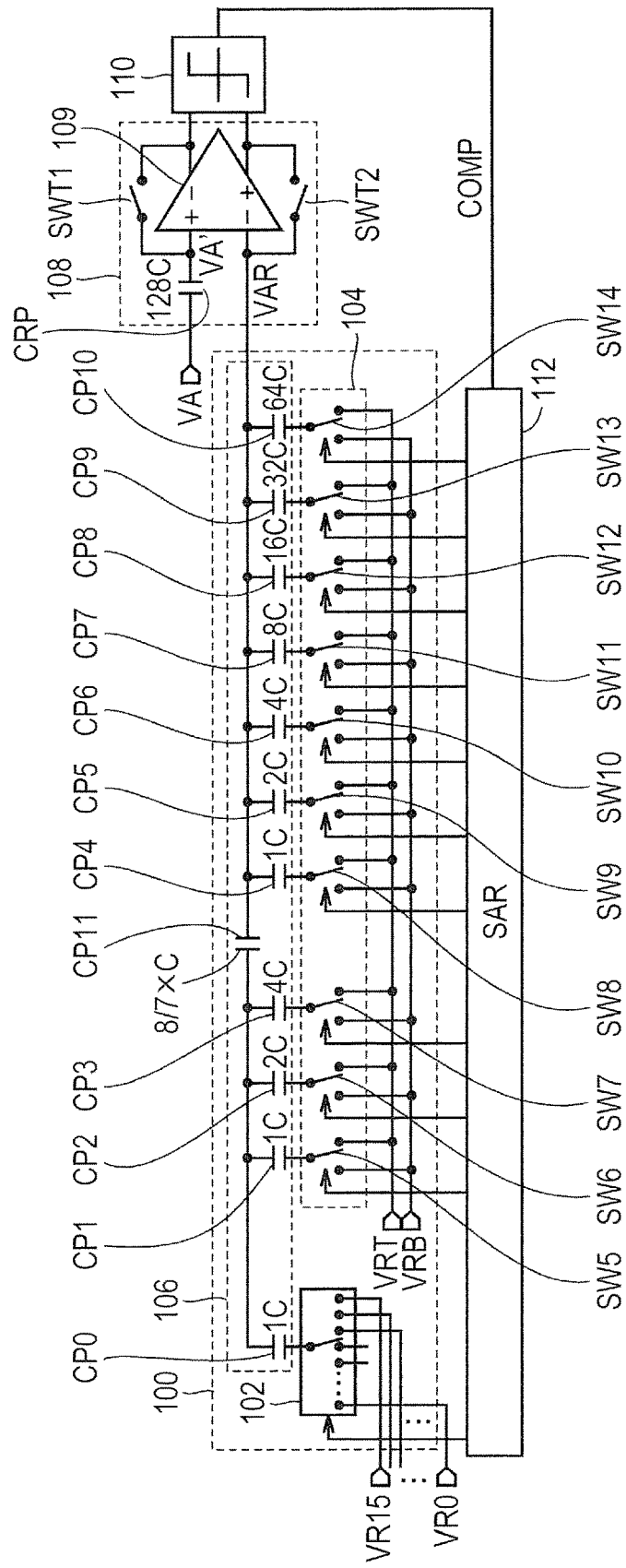
FIG. 6 is a circuit configuration diagram illustrating the A/D converter according to the first embodiment.

FIG. 6 is a circuit configuration diagram illustrating the A/D converter 11 according to the first embodiment.

As illustrated in FIG. 6, the A/D converter 11 includes the S/H circuit 108, the D/A converter 100, and the comparator 110.

The S/H circuit 108 includes an amplifier 109, a capacitor CRP, and switches SWT1, SWT2.

The capacitor CRP stores electrical charge based on an analog pixel signal VA. The capacitance value of the capacitor CRP is set to 128C.

The switch SWT1 is disposed between an output terminal (negative electrode) and input terminal (positive electrode) of the amplifier 109. The switch SWT2 is disposed between an output terminal (positive electrode) and input terminal (negative electrode) of the amplifier 109. The switches SWT1, SWT2 function as an auto-zero switch.

The comparator 110 compares voltages sampled by the S/H circuit 108 and outputs the output signal COMP.

The D/A converter 100 includes the multiplexer 102, the switch array 104, and the capacitor array 106.

The capacitor array 106 includes plural capacitors CP0-CP11 (which may be generically referred to as the capacitors CP).

The capacitor CP11 is a split capacitor.

One electrode of the capacitor CP11 is coupled to an output node of the D/A converter 100.

One electrode of the capacitor CP0 is coupled to the other electrode of the capacitor CP11. One electrode of each of the capacitors CP1-CP3 is coupled to the other electrode of the capacitor CP11 in parallel with the capacitor CP0.

One electrode of each of the capacitors CP4-CP10 is coupled to the output node of the D/A converter 100.

The switch array 104 includes switches SW5-SW14 (which may be generically referred to as the switches SW).

The switches SW5-SW14 are each controlled by the SAR 112 in accordance with the output signal COMP indicative of the result of comparison between the voltage of the sampling pixel signal VA' and the voltage of the analog reference signal VAR.

More specifically, the switches SW5-SW14 are respectively provided for the capacitors CP1-CP10. The switches SW are each couplable to either the reference voltage VRT or the reference voltage VRB.

In compliance with an instruction from the SAR 112, the switches SW are each coupled to the other electrode of a capacitor CP that corresponds to either the reference voltage VRT or the reference voltage VRB.

The multiplexer 102 is coupled to the other electrode of the capacitor CP0.

In compliance with an instruction from the SAR 112, the multiplexer 102 couples one of the reference voltages VR0-VR15 to the other electrode of the capacitor CP0.

When the capacitance value of the capacitor CP0 is 1C, the capacitance values of the capacitors CP1, CP2, CP3 are sequentially increased in twofold increments and set to 1C, 2C, and 4C, respectively.

The capacitance value of the capacitor CP11, which is a split capacitor, is set to 8C/7. The capacitance values of the capacitors CP4-CP10 are sequentially increased in twofold increments and set to 1C, 2C, 4C, 8C, 16C, 32C, and 64C, respectively.

An operation of the S/H circuit 108 is described below. When the switches SWT1, SWT2 conduct, the input and output terminals of the amplifier 109 in the S/H circuit 108 are shorted to create a balanced state. In this instance, the control circuit 10 depicted in FIG. 1 controls the pixel circuit P so that a no-signal voltage is inputted to the analog pixel signal VA. The capacitor CRP is charged by the no-signal voltage inputted from the analog pixel signal VA and by a voltage generated in the balanced state, which is created when the input and output terminals of the amplifier 109 are shorted. In this instance, the digital reference signal DR of the D/A converter 100 is in the "0" state.

During a sampling operation, the switches SWT1, SWT2 are non-conducting. Accordingly, the input and output terminals are uncoupled from each other. After such uncoupling, the control circuit 10 depicted in FIG. 1 controls the pixel circuit P so that a voltage based on a luminance signal is inputted to the analog pixel signal VA. An analog pixel signal VA change from a no-signal state is conveyed through the capacitor CRP to the input terminal (positive electrode) of the amplifier 109 and stored as the sampling pixel signal VA'.

A voltage change is conveyed through the capacitor array 106 to the input terminal (negative electrode) of the amplifier 109 so as to generate a voltage based on the digital reference signal DR.

The comparator 110 compares the input terminal (positive electrode) with the input terminal (negative electrode) and outputs the output signal COMP indicative of the result of comparison.

In the present embodiment, a comparison operation is performed in accordance with switching operations of the switches SW.

More specifically, for the determination of the 14th bit, the switch SW14 operates so that the reference voltage VRT is applied to the other electrode of the capacitor CP10. The other switches SW5-SW13 couple the reference voltage VRB to the other electrode of the associated capacitor CP.

For the determination of the 13th bit, the switch SW13 operates so that the reference voltage VRT is applied to the other electrode of the capacitor CP9. If the output signal COMP indicative of the comparison result of the 14th bit is "0", the switch SW14 couples the reference voltage VRB to the other electrode of the capacitor CP10. If, by contrast, the output signal COMP indicative of the comparison result of the 14th bit is "1", the switch SW14 maintains a state where the reference voltage VRT is coupled to the other electrode of the capacitor CP10.

For the determination of the 12th bit, the switch SW12 operates so that the reference voltage VRT is applied to the other electrode of the capacitor CP8. If the output signal COMP indicative of the comparison result of the 13th bit is "0", the switch SW13 couples the reference voltage VRB to the other electrode of the capacitor CP9. If, by contrast, the output signal COMP indicative of the comparison result of the 13th bit is "1", the switch SW13 maintains a state where the reference voltage VRT is coupled to the other electrode of the capacitor CP9.

The same operation as described above is performed for the determination of the 11th to 5th bits.

When the determination of the 5th bit terminates, the multiplexer 102 operates.

More specifically, one of the reference voltages VR0-VR15 is coupled to the other electrode of the capacitor CP0 in accordance with the binary search method. The 4th to 1st bits are determined in accordance with the binary search method described with reference to FIGS. 5A and 5B.

The capacitor array 106 in the present embodiment uses a split capacitor (capacitor CP11).

If the analog reference signal VAR for a 10-bit sub-range region is to be generated by using a unit capacitor instead of a split capacitor, it is necessary to use a large number of unit capacitors (e.g., 1024 unit capacitors) having the same capacitance value.

Meanwhile, when a split capacitor is used as described in conjunction with the present embodiment, the configuration may be achieved by using, for example, approximately 136 capacitance values. This results in a considerable decrease in the circuit area (area reduction).

The combined capacitance of a split capacitor and lower-order capacitors needs to be equal to the capacitance value of unit capacitors in higher order than the split capacitor.

Consequently, the following equation can be used for calculation.

$$\frac{1}{\frac{1}{4C+2C+1C+1C}+\frac{1}{C_{SPL}}} = 1C \quad \text{Equation 1}$$

where $C_{SPL}$ is the capacitance value of the split capacitor.

Accordingly, the capacitance value of the split capacitor is 8C/7.

In the present embodiment, seven bits out of ten high-order bits are determined by capacitors that are disposed so as to precede the split capacitor, and the remaining three bits are determined by capacitors that are disposed so as to follow the split capacitor. The position of the split capacitor is not limited to the above-described one. The split capacitor may alternatively be positioned so as to divide a set of ten high-order bits into a group of six bits and a group of remaining four bits.

If, for example, the split capacitor is positioned so as to divide a set of ten high-order bits into a group of five bits and a group of remaining five bits, the number of unit capacitors can be considerably decreased to achieve area reduction in the most efficient manner. The configuration may be achieved by using, for example, approximately 64 capacitance values.

Further, the present embodiment is configured so that the reference voltages VRT, VRB, which are outputted from the reference voltage generation circuit 6 in order to generate the analog reference signal VAR for high-order A/D conversion, are applied to the capacitor array 106. Additionally, the sixteen reference voltages VR0-VR15, which are outputted from the reference voltage generation circuit 8 in order to generate the analog reference signal VAR for low-order A/D conversion, are coupled to the capacitor CP0 through the multiplexer 102.

The analog reference signal VAR has a voltage value that is dependent on a voltage value coupled to the associated capacitor CP0-CP10 in the capacitor array 106. That is to say, the settling time of the analog reference signal VAR depends on the charge/discharge time of the capacitor CP0-CP10. In the present embodiment, the reference voltages VRT, VRB are based on the constant voltage sources and outputted from the reference voltage generation circuit 6 without regard to resistance division. Therefore, the time constant related to the charge/discharge time of the capacitors CP, which is based on the reference voltages VRT, VRB, is smaller than when the reference voltages VR0-VR15 generated by using resistors are used. Consequently, the analog reference signal VAR can be settled more rapidly than when the reference voltages VR0-VR15 based on resistance division are used.

Moreover, according to Japanese Unexamined Patent Application Publication No. 2014-241492, the reference voltage generated by using resistors needs to be charged into and discharged from all capacitors in a capacitor array. Meanwhile, in the present embodiment, the capacitance value of the capacitor CP0, which is charged/discharged through the multiplexer 102 in accordance with the reference voltages VR0-VR15, is set to 1C. Therefore, even when the reference voltages VR0-VR15 are used, the analog reference signal VAR can be rapidly settled.

The above-described method is capable of reducing the settling time of the analog reference signal of the D/A converter 100. This enables the A/D converter 11 to operate at high speed and the solid-state imaging device to increase its frame rate.

While the present embodiment has been described on the assumption that 14 bits are used. However, the present embodiment is not limited to such a case and is also applicable to a case where a different number of bits are used. Further, it has been assumed that 10 bits are used for high-order bit A/D conversion, and that 4 bits are used for low-order bit A/D conversion. However, the number of bits is not limited to such numbers.

Second Embodiment

The first embodiment has been described with reference to the method of achieving area reduction by disposing a split capacitor in the capacitor array 106.

Meanwhile, it is conceivable that differential nonlinearity (DNL) degradation may occur due to an error in the manufacture of a split capacitor.

FIGS. 7A and 7B are diagrams illustrating examples of wiring between reference voltages and the capacitor array 106 of the D/A converter 100.

FIG. 7A illustrates a wiring between the capacitor array 106 and reference voltages that prevails when the digital reference signal DR is "127".

FIG. 7B illustrates a wiring between the capacitor array 106 and reference voltages that prevails when the digital reference signal DR is "128".

The wiring between capacitors and reference voltages at bit positions lower in order than the split capacitor changes depending on whether the digital reference signal DR is "127" or "128".

When the DNL of an A/D converter is to be reduced to less than 1 LSB (Least Significant Bit), the DNL of a D/A converter needs to be reduced to less than 1 LSB. However, DNL degradation occurs if the capacitance value of the split capacitor deviates from a design value due to an error in the manufacture of the split capacitor. Further, DNL may occur due to an error caused by wiring parasitic capacitance or by parasitic capacitance of a unit capacitor.

Figure 8C:
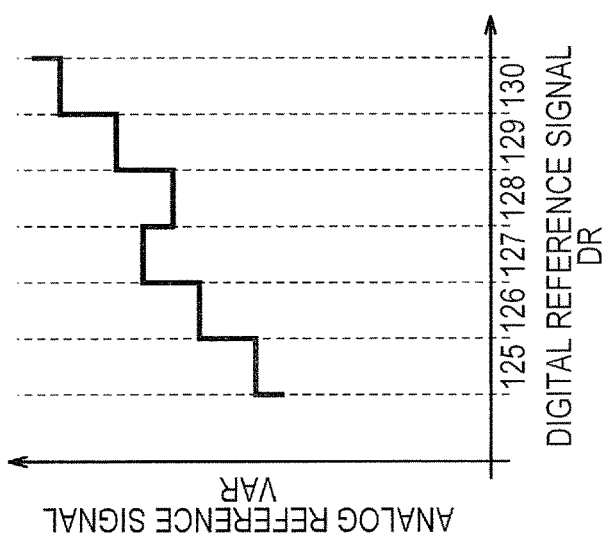
FIGS. 8A to 8C are diagrams illustrating the relationship between a digital reference signal in the vicinity of 128 and an analog reference signal.
Figure 8B:
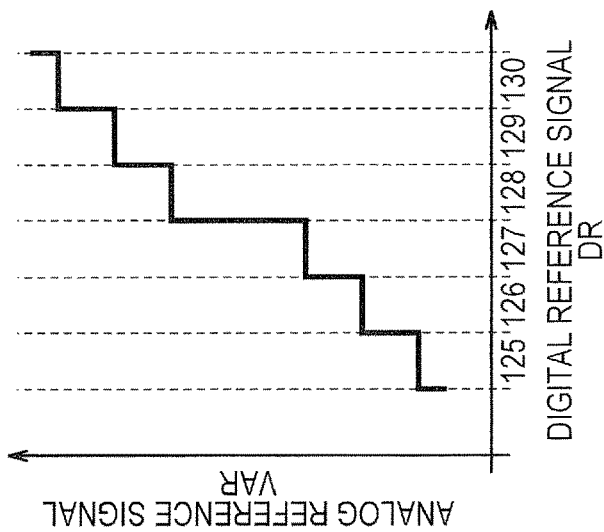
Figure 8A:
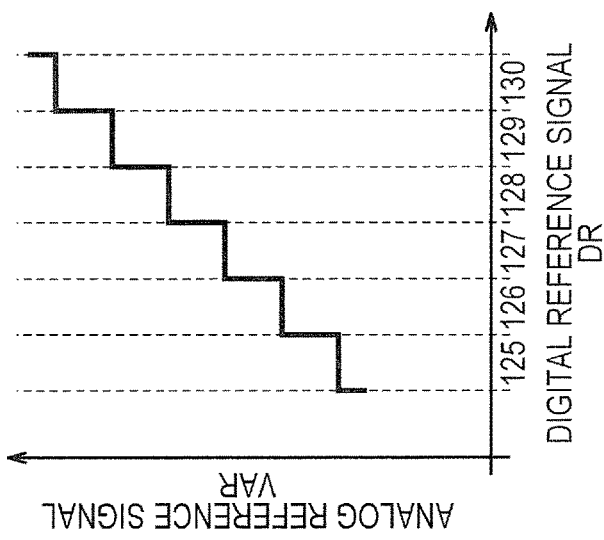

FIGS. 8A to 8C are diagrams illustrating the relationship between the digital reference signal DR in the vicinity of 128 and the analog reference signal VAR that prevails when the capacitance value of the split capacitor is changed.

FIG. 8A illustrates a case where the capacitance value of the split capacitor is equal to a design value.

In the above case, the DNL is normal and less than 1 LSB.

FIG. 8B illustrates a case where the capacitance value of the split capacitor is smaller than the design value.

In the above case, DNL has occurred to cause an error, for example, of approximately +1.5 LSB.

FIG. 8B illustrates a case where the capacitance value of the split capacitor is greater than the design value.

In the above case, DNL has occurred to cause an error, for example, of approximately −1.5 LSB.

The larger the number of bits lower in order than the split capacitor, the higher the capacitance value accuracy required for the split capacitor. When, for example, DNL of less than 1 LSB is to be achieved, the allowable error of the split capacitor is such that an accuracy of 1/128 is required in a case where there are 7 low-order bits. The required accuracy is 1/256 when there are 8 low-order bits and 1/512 when there are 9 low-order bits.

Figure 9:
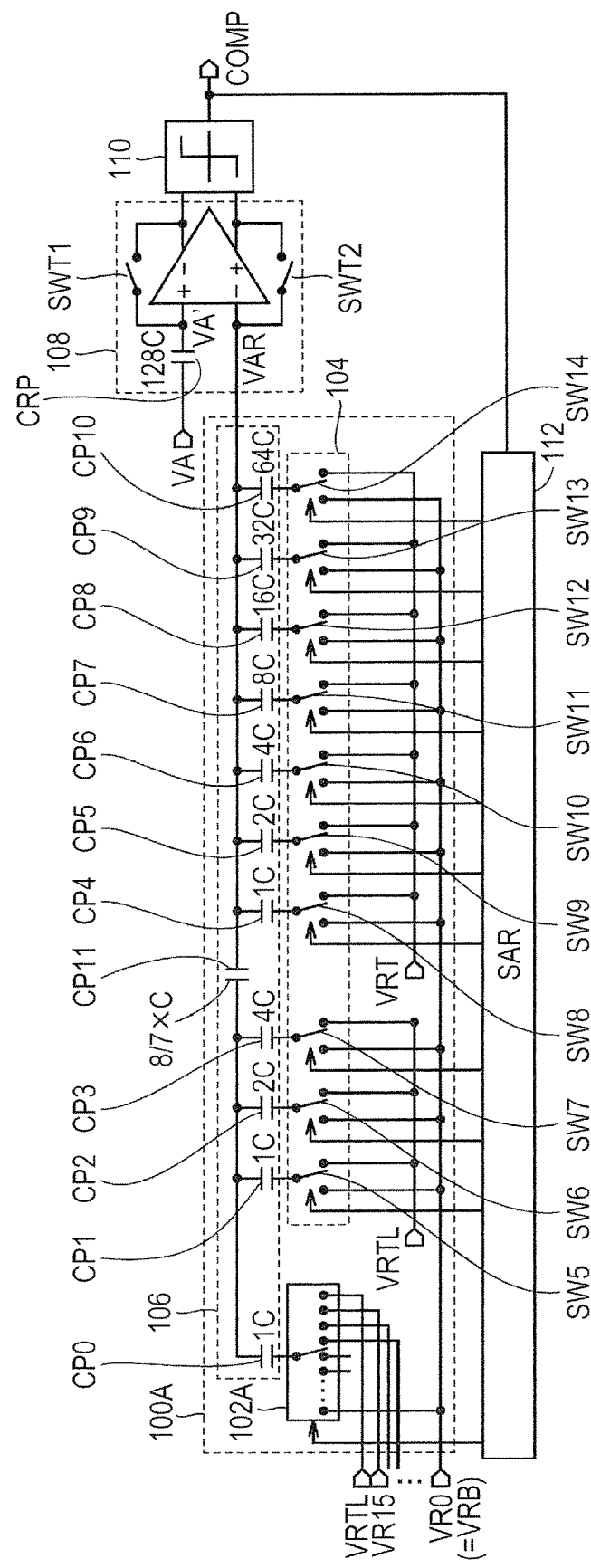
FIG. 9 is a circuit configuration diagram illustrating a D/A converter according to a second embodiment of the present disclosure.

FIG. 9 is a circuit configuration diagram illustrating a D/A converter 100A according to a second embodiment of the present disclosure.

As illustrated in FIG. 9, the D/A converter 100A is different from the D/A converter 100 in that the former uses a multiplexer 102A in place of the multiplexer 102.

The multiplexer 102A is disposed so that a reference voltage VRTL different from the reference voltage VRT can be selectively coupled to the other electrode of the capacitor CP0.

Further, the switches SW5-SW7, which are related to capacitors CP at bit positions lower in order than the capacitor CP11 acting as a split capacitor, are disposed so that the reference voltage VRTL and the reference voltage VRB can be selectively coupled to the other electrodes of the capacitors CP.

Figure 10:
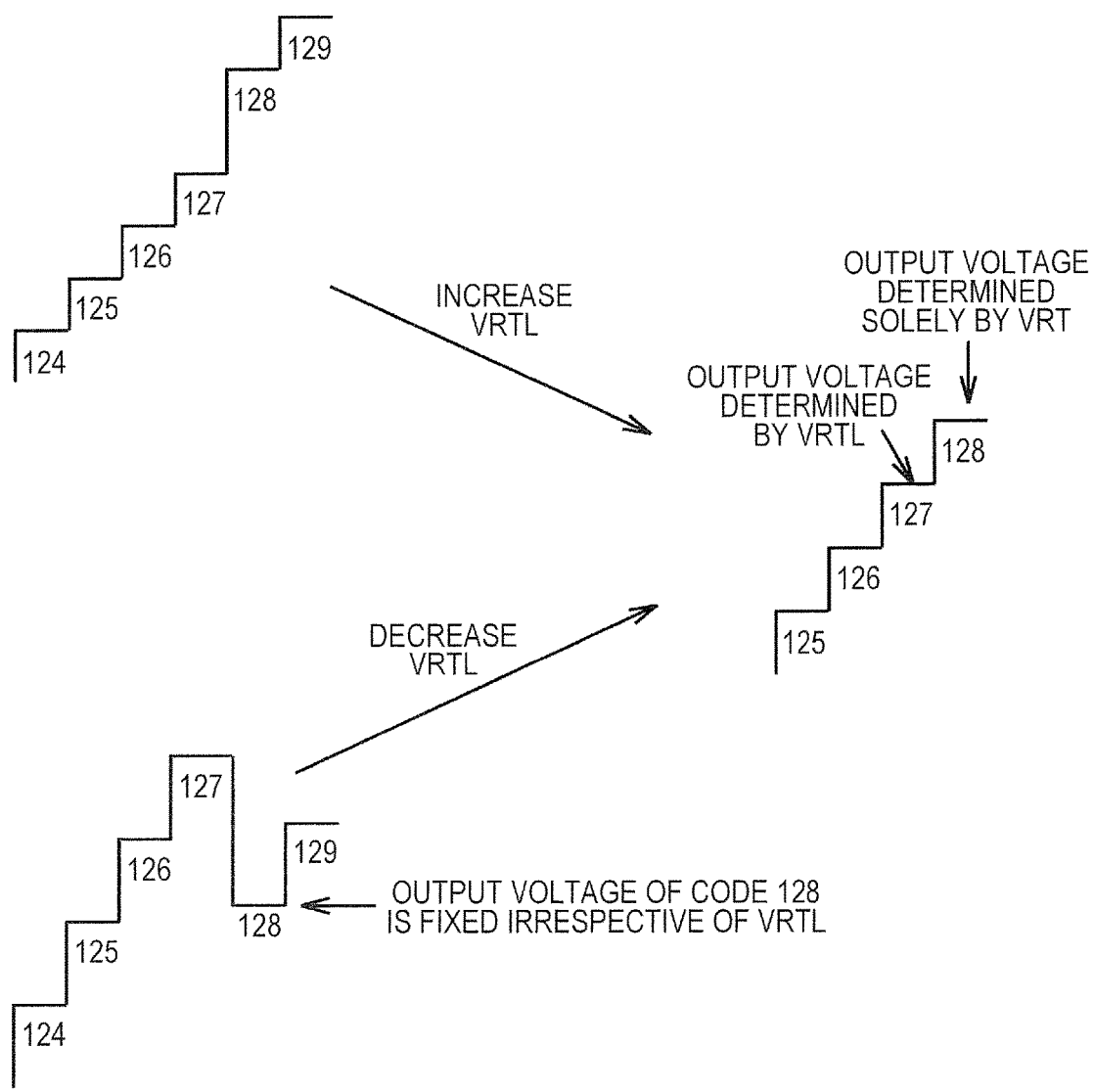
FIG. 10 is a diagram illustrating a DNL correction method according to the second embodiment.

FIG. 10 is a diagram illustrating a DNL correction method according to the second embodiment.

As illustrated in FIG. 10, if the DNL is not less than 1 LSB, the reference voltage VRTL higher than the normal reference voltage VRT is applied.

If, by contrast, the DNL is negative, the reference voltage VRTL lower than the normal reference voltage VRT is applied.

Figure 11:
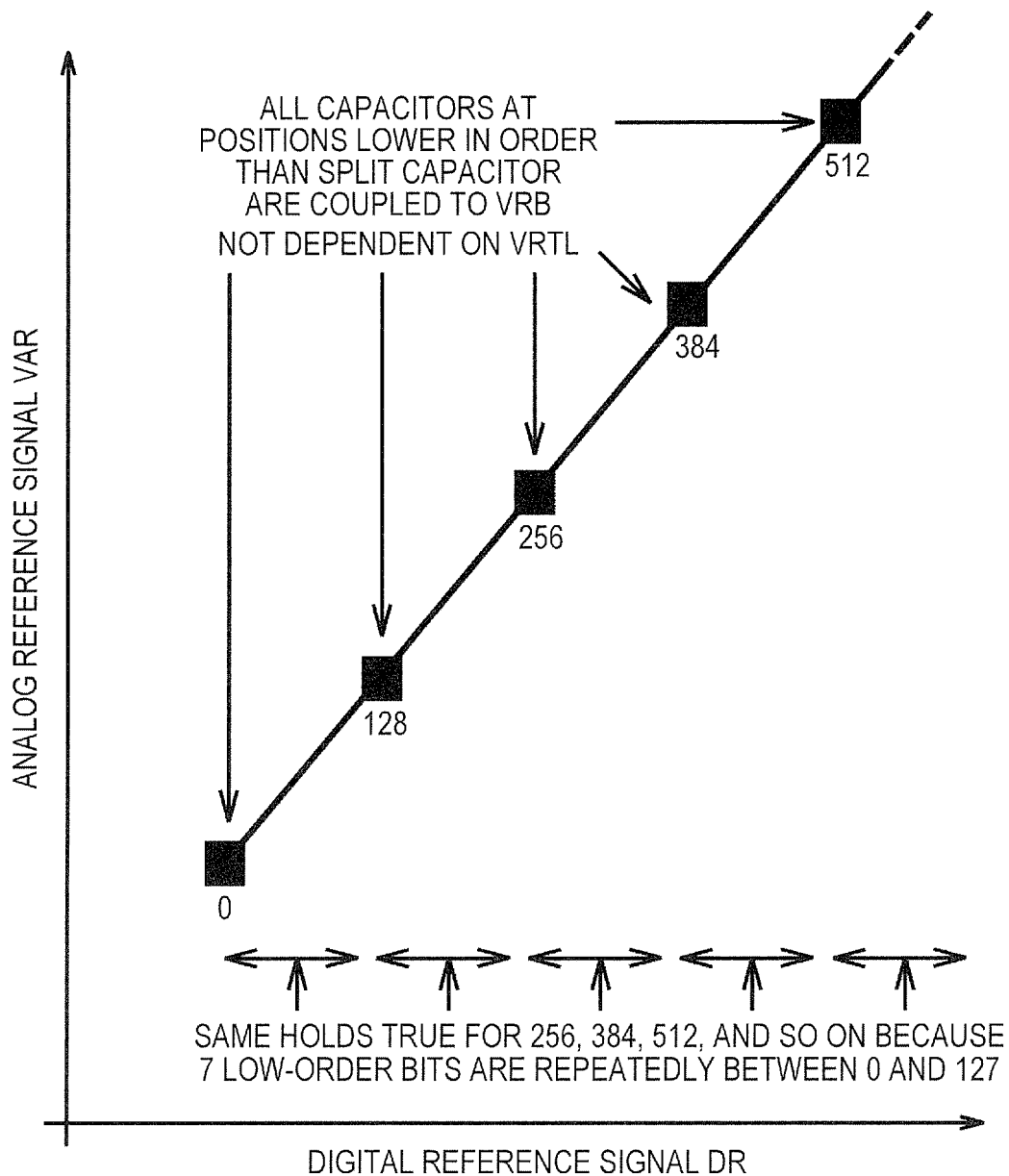
FIG. 11 is a diagram illustrating the relationship between the digital reference signal and the analog reference signal that prevails after correction according to the second embodiment.

FIG. 11 is a diagram illustrating the relationship between the digital reference signal DR and the analog reference signal VAR that prevails after correction according to the second embodiment.

As illustrated in FIG. 11, if the digital reference signal DR is 0 or 128, all capacitors disposed at positions lower in order than the split capacitor are coupled to the reference voltage VRB. In this instance, therefore, the analog reference signal VAR is not dependent on the reference voltage VRTL.

Meanwhile, if the digital reference signal DR is between 0 and 127, the capacitors CP4-CP10 depicted in FIG. 9 are coupled to the reference voltage VRB. In this instance, the difference from a digital reference signal DR of 0 is proportional to the difference in the associated analog reference signal VAR. Further, when the digital reference signal DR is increased by 1, the resulting voltage increase in the analog reference signal VAR is proportional to (VRTL-VRB).

Consequently, the DNL caused by an error in the manufacture of the split capacitor or by a parasitic capacitor can be corrected by adjusting the reference voltage VRTL, based on the analog reference signal VAR prevailing when the digital reference signal DR is 128, in such a manner that the analog reference signal VAR is 127/128 when the digital reference signal DR is 127.

Further, when the digital reference signal DR is between 128 and 255, a change is made so that the capacitor CP4 depicted in FIG. 9 is coupled to the reference voltage VRT. However, capacitors disposed at positions lower in order than the split capacitor are coupled in the same manner as when the digital reference signal DR is between 0 and 127.

That is to say, the difference from a digital reference signal DR of 128 is proportional to the difference in the associated analog reference signal VAR.

Further, when the digital reference signal DR is increased by 1, the resulting voltage increase in the analog reference signal VAR is determined by voltage division of the capacitors CP0-CP11. Therefore, without regard to the coupling destination of the capacitor CP4, while the reference voltage VRTL remains unchanged, the voltage increase in the analog reference signal VAR when the digital reference signal DR is increased by 1 is the same as when the digital reference signal DR is between 0 and 127.

Consequently, the reference voltage VRTL adjusted when the digital reference signal DR is 128 is an appropriate voltage even when the digital reference signal DR is 256. The same holds true when the digital reference signal DR is 384, 512, or higher.

Figure 12:
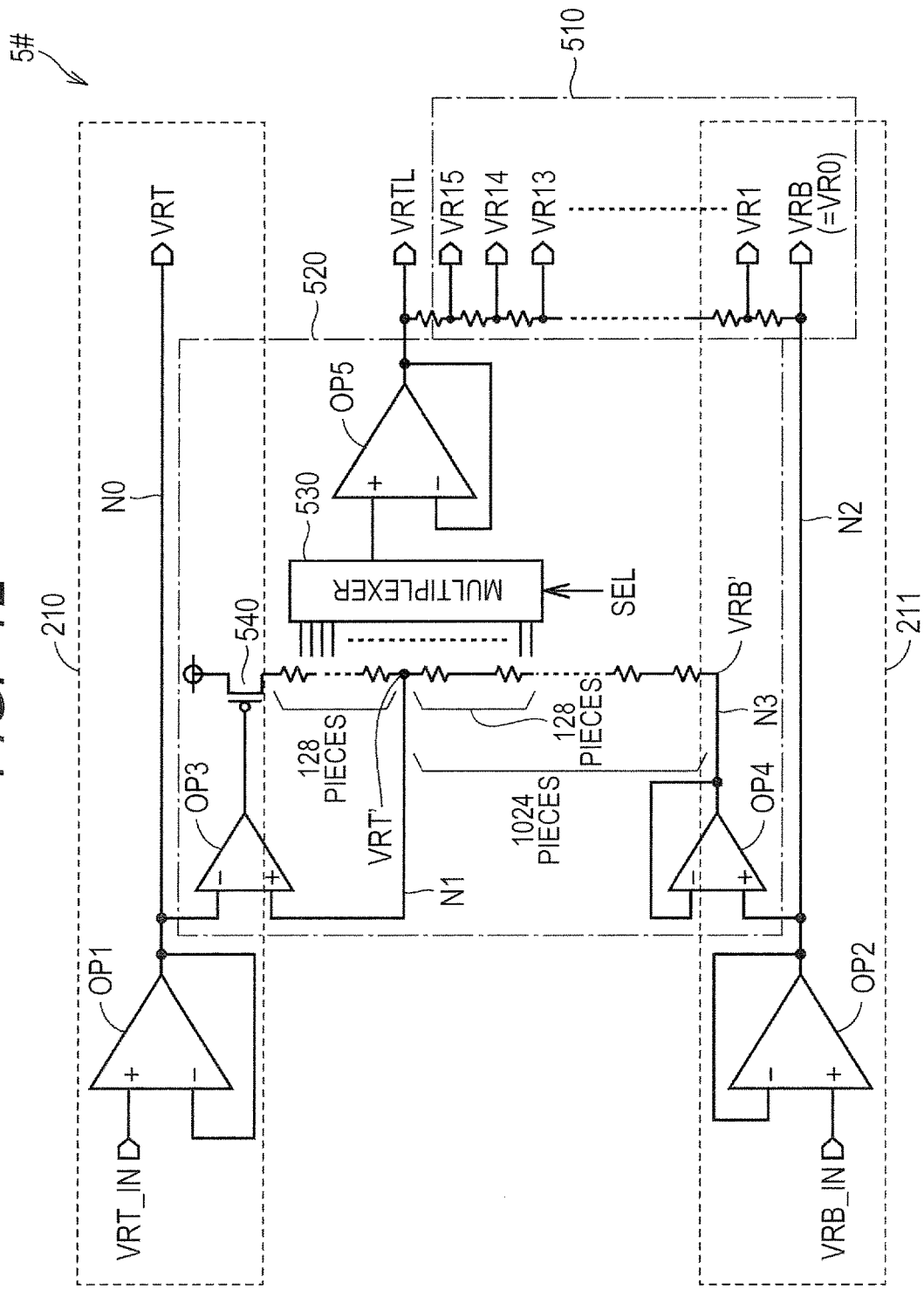
FIG. 12 is a diagram illustrating a reference voltage generation circuit according to the second embodiment.

FIG. 12 is a diagram illustrating a reference voltage generation circuit 5# according to the second embodiment.

As illustrated in FIG. 12, the reference voltage generation circuit 5# generates the reference voltages VR0-VR15 and the reference voltage VRTL in addition to the reference voltages VRT, VRB.

More specifically, the reference voltage generation circuit 5# includes constant voltage sources 210, 211, a voltage generation unit 520 for generating the reference voltage VRTL (third reference voltage), and a voltage generation unit 510 for generating the reference voltages VR0-VR15 (second reference voltage).

The constant voltage source 210 includes an operational amplifier OP1, and forms a voltage follower circuit by coupling an output node N0 to an input terminal (negative electrode). Accordingly, a voltage at the same potential as a voltage VRT_IN inputted to an input terminal (positive electrode) is generated at the output node N0 and then outputted.

The constant voltage source 211 includes an operational amplifier OP2, and forms a voltage follower circuit by coupling an output node N2 to an input terminal (negative electrode). Accordingly, a voltage at the same potential as a voltage VRB_IN inputted to an input terminal (positive electrode) is generated at the output node N2 and then outputted.

The voltage generation unit 510 generates the reference voltages VR0-VR15 based on resistance division of plural resistive elements disposed between the reference voltage VRTL and the reference voltage VRB.

The voltage generation unit 520 includes operational amplifiers OP3, OP4, OP5, a multiplexer 530, plural resistive elements used for resistance division, and a P-channel MOS transistor 540.

The operational amplifier OP3 is coupled at an input terminal (negative electrode) to the node N0. The output node of the operational amplifier OP3 is coupled to the gate of the P-channel MOS transistor 540. The P-channel MOS transistor 540 is coupled between a power supply voltage and a node N1 together with the 128 resistive elements. The node N1 is coupled to an input terminal (positive electrode) of the operational amplifier OP3.

The operational amplifier OP3 adjusts the output node coupled to the gate of the P-channel MOS transistor 540 in such a manner that the node N1 and the node NO are equal in voltage. That is to say, a reference voltage VRT' substantially equal to the reference voltage VRT is generated at the node N1.

The multiplexer 530 receives reference voltages resistance-divided by the resistive elements, and outputs one of the received reference voltages to an input terminal (positive electrode) of the operational amplifier OP5 in accordance with a control signal SEL. The control circuit 10 outputs the control signal SEL for controlling the multiplexer 530.

The operational amplifier OP5 forms a voltage follower circuit with an output node coupled to an input terminal (negative electrode). Accordingly, a voltage inputted to the input terminal (positive electrode) of the operational amplifier OP5 is handled as the reference voltage VRTL and outputted as the output voltage of the operational amplifier OP5.

The operational amplifier OP4 forms a voltage follower circuit with an output node N3 coupled to an input terminal (negative electrode). Accordingly, a voltage (reference voltage VRB) inputted to an input terminal (positive electrode) of the operational amplifier OP4 is handled as the reference voltage VRB' and outputted as the output voltage of the operational amplifier OP4.

A total of 1024 resistive elements are disposed between the node N1 and the node N3. That is to say, the reference voltage VRTL is adjustable in 1024 steps.

Further, a total of 128 resistive elements are disposed between the node N1 and the P-channel MOS transistor 540. Therefore, the reference voltage VRTL can be adjusted as a voltage higher than the reference voltage VRT.

The multiplexer 530 is coupled to the coupling nodes of 128 resistive elements that are disposed toward the P-channel MOS transistor 540 with the node N1 centered.

Further, the multiplexer 530 is coupled to the coupling nodes of 128 resistive elements that are among 1024 resistive elements disposed toward the node N3.

That is to say, the multiplexer 530 is coupled to the 256 coupling nodes centered with respect to the node N1.

The multiplexer 530 selects one of the 256 coupling nodes in accordance with an inputted control signal SEL, which is an 8-bit data signal, and outputs a reference voltage based on the selected coupling node to the input terminal (positive electrode) of the operational amplifier OP5.

The reference voltage can be adjusted by changing the data signal acting as the control signal SEL.

Figure 13A:
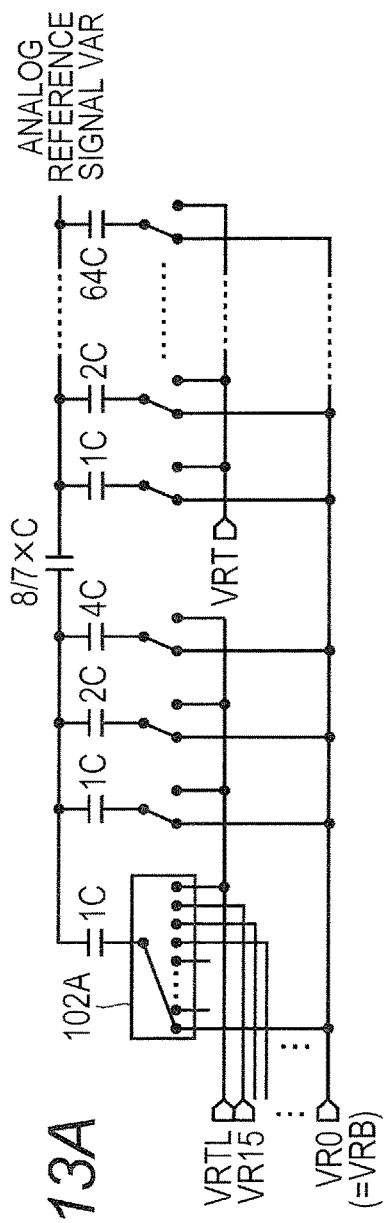
FIGS. 13A and 13B are diagrams illustrating the adjustment range of a reference voltage that is covered by the reference voltage generation circuit.
Figure 13B:
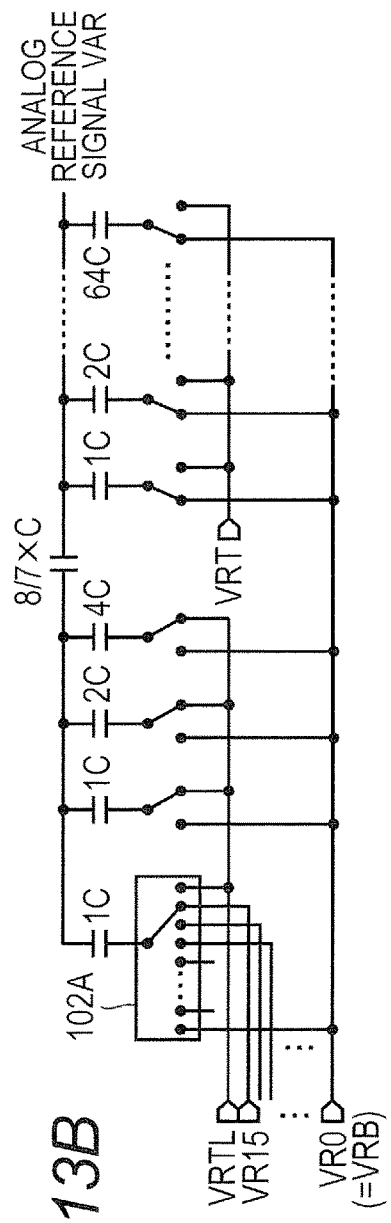

FIGS. 13A and 13B are diagrams illustrating the adjustment range of the reference voltage VRTL that is covered by the reference voltage generation circuit 5#.

FIG. 13A illustrates a wiring between the capacitor array 106 and the reference voltages that prevails when the bit code is "0".

When the bit code is "0", all the capacitors are coupled to the reference voltage VRB, and none of the capacitors is coupled to the reference voltage VRTL. Therefore, the analog reference voltage VAR is not dependent on the reference voltage VRTL.

FIG. 13B illustrates a wiring between the capacitor array 106 and the reference voltages that prevails when the bit code is "127".

When the bit code is "127", all capacitors disposed at positions lower in order than the split capacitor are coupled to the reference voltage VRTL except the lowest-order capacitor. Only the lowest-order capacitor is coupled to the reference voltage VR15.

The reference voltage VR15 is set to (15/16)×(VRTL−VRB)+VRB.

When coupled as mentioned above, the reference voltage VRTL is proportional to a 127 LSB analog reference signal VAR.

Consequently, in the configuration according to the second embodiment, the reference voltage VRTL is resistance-divided by 1024 resistive elements as illustrated in FIG. 12 so that 256 tap voltages centered with respect to the reference voltage VRT' can be selected through the multiplexer 530.

Accordingly, adjustments can be made in units of 127/1024 (≈1/8) LSB. As illustrated in FIG. 12, the multiplexer 530 is coupled to the coupling nodes of 128 upper resistive elements and 128 lower resistive elements. This makes it possible to make 16 LSB (128 taps×1/8) upward adjustments and 16 LSB downward adjustments, that is, a total of 32 LSB adjustments.

The present embodiment has been described on the assumption that the employed codes are "0" and "127". However, the same holds true when the employed codes are "128" and "255", "256" and "383", or higher.

When the above-described method is used, the reference voltage VRTL can be adjusted to inhibit DNL degradation from being caused by an error in the manufacture of the split capacitor.

Third Embodiment

A third embodiment of the present disclosure will now be described with reference to a system that automatically corrects the reference voltage VRTL.

Figure 14:
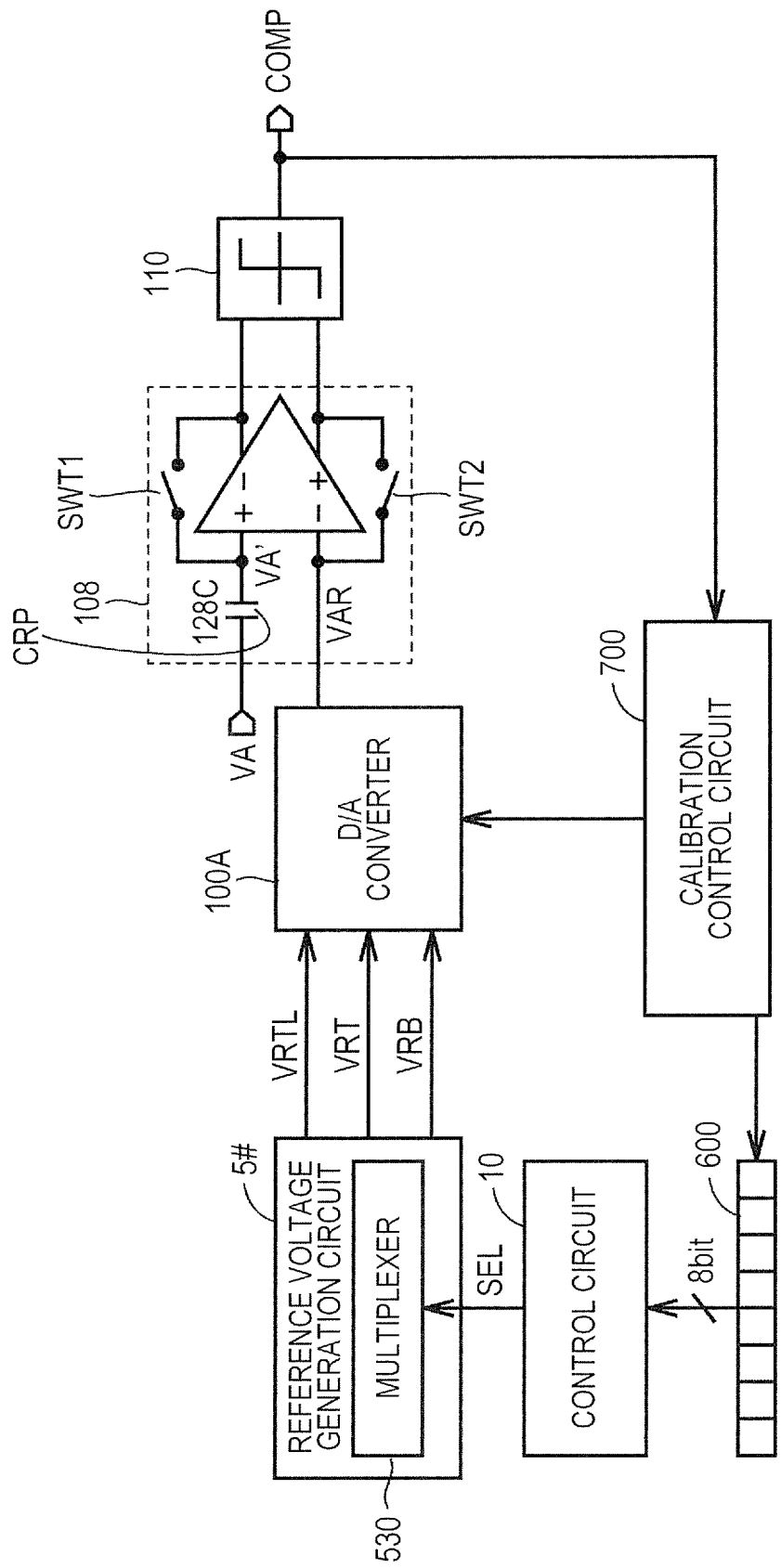
FIG. 14 is a functional block diagram illustrating a correction system according to a third embodiment of the present disclosure.

FIG. 14 is a functional block diagram illustrating a correction system according to the third embodiment.

Depicted in FIG. 14 are the reference voltage generation circuit 5#, the D/A converter 100A, the S/H circuit 108, the comparator 110, the control circuit 10, a register 600, and a calibration control circuit 700.

The third embodiment differs in configuration from the second embodiment in that the former newly includes the register 600 and the calibration control circuit 700. The other elements are the same as the corresponding elements included in the second embodiment and will not be redundantly described.

The reference voltage generation circuit 5# includes the multiplexer 530 as mentioned earlier.

The control circuit 10 outputs the control signal SEL to the multiplexer 530 in accordance with the 8-bit register 600. As described earlier, the reference voltage VRTL can be adjusted in 256 steps in compliance with the control signal SEL. More specifically, the reference voltage generation circuit 5# outputs the minimum reference voltage VRTL in compliance with the control signal SEL generated when the code of the register 600 is "0". Meanwhile, the reference voltage generation circuit 5# outputs the maximum reference voltage VRTL in compliance with the control signal SEL generated when the code of the register 600 is "255".

In the third embodiment, a binary search is performed to adjust the reference voltage VRTL in compliance with an instruction from the calibration control circuit 700.

More specifically, a 128 LSB equivalent analog reference signal VAR (referred to also as a 128 LSB equivalent voltage) is generated by using capacitors disposed at positions lower in order than the capacitor CP11, which is a split capacitor.

Subsequently, a normal 128 LSB analog reference signal VAR (referred to also as a 128 LSB voltage) is generated.

The 128 LSB equivalent voltage is then compared with the 128 LSB voltage, and the register 600 is set to a value at which the 128 LSB equivalent voltage approximates the 128 LSB voltage.

Figure 15A:
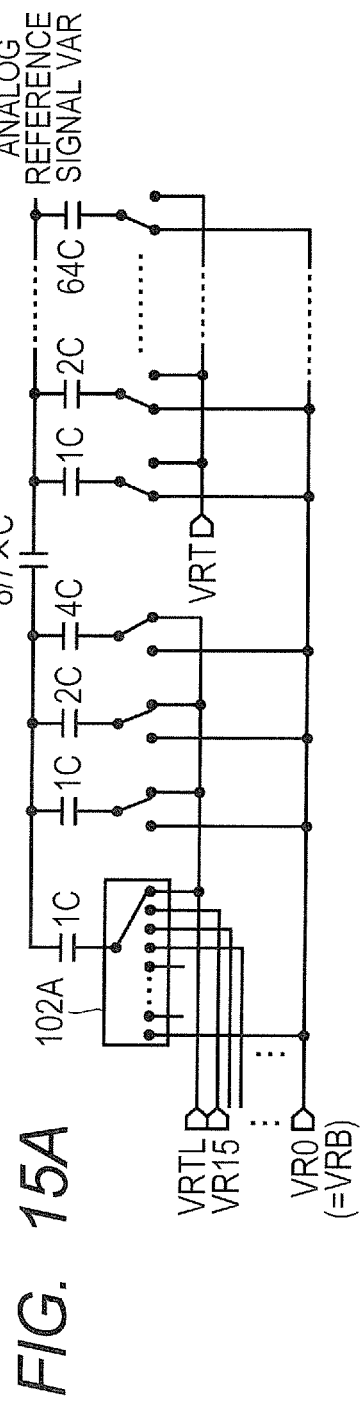
FIGS. 15A and 15B are diagrams illustrating a 128 LSB voltage generated by the reference voltage generation circuit.
Figure 15B:
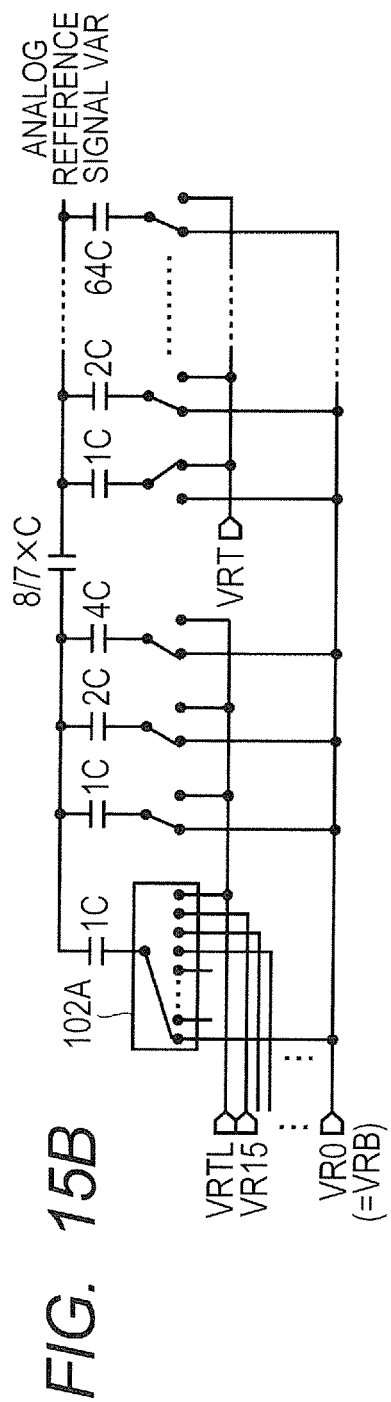

FIGS. 15A and 15B are diagrams illustrating the 128 LSB voltage generated by the reference voltage generation circuit 5#.

As illustrated in FIG. 15A, the 128 LSB equivalent analog reference signal VAR (referred to also as the 128 LSB equivalent voltage) is generated by using capacitors disposed at positions lower in order than the capacitor CP11, which is a split capacitor. More specifically, the 128 LSB equivalent voltage is generated by setting a voltage that is 1 LSB higher than the analog reference signal VAR generated when the code is "127" as described with reference to FIG. 7A.

The calibration control circuit 700 generates the 128 LSB equivalent voltage by setting the register 600, issuing an instruction to the multiplexer 102A, and controlling the switch array 104.

In the present embodiment, the calibration control circuit 700 first sets the most significant bit (MSB) of the 8-bit register 600 to "1" and sets the other bits to "0". In this instance, the register code of the 8-bit register 600 is "128". The reference voltage generation circuit 5# generates and outputs the reference voltages VRTL, which are ½ the maximum and minimum reference voltages.

In accordance with the reference voltage VRTL based on the register code "128", the calibration control circuit 700 instructs the multiplexer 102A to apply to the capacitor CP0 the reference voltage VRTL that is higher than the reference voltage VR15. Further, the calibration control circuit 700 issues an instruction to the switch array 104 in order to instruct the switches SW5-SW7 to apply the reference voltage VRTL to the associated capacitors CP1-CP3.

Consequently, the 128 LSB equivalent analog reference signal VAR can be generated in accordance with the reference voltage VRTL based on the register code "128".

The calibration control circuit 700 also controls the auto-zero switches of the S/H circuit 108. In an initial state, the auto-zero switches of the S/H circuit 108 are on.

When the 128 LSB equivalent voltage is to be sampled, the calibration control circuit 700 turns off the auto-zero switches. While a comparison is in progress, a terminal to which a signal VA coupled to the capacitor CRP of the S/H circuit 108 is inputted is coupled to a fixed voltage and made invariable.

As illustrated in FIG. 15B, the normal 128 LSB analog reference signal VAR (128 LSB voltage) is generated. More specifically, the calibration control circuit 700 instructs the multiplexer 102A to apply the reference voltage VRB to the capacitor CP0. Further, the calibration control circuit 700 issues an instruction to the switch array 104 in order to instruct the switches SW5-SW7 to apply the reference voltage VRB to the associated capacitors CP1-CP3. The calibration control circuit 700 also instructs the switch SW8 to apply the reference voltage VRT to the associated capacitor CP4.

Consequently, the 128 LSB analog reference signal VAR can be generated.

Accordingly, the comparator 110 compares the 128 LSB voltage with the previously sampled 128 LSB equivalent voltage, and outputs the output signal COMP indicative of the result of comparison.

In accordance with the output signal, the calibration control circuit 700 sets the register 60.

More specifically, when the 128 LSB equivalent voltage based on the register code "128" is compared with the 128 LSB voltage, and the output signal COMP ("H" level) indicates that 128 LSB equivalent voltage>128 LSB voltage, the most significant bit is set to "0". Meanwhile, when the 128 LSB equivalent voltage is compared with the 128 LSB voltage, and the output signal COMP ("L" level) indicates that 128 LSB equivalent voltage≤128 LSB voltage, the most significant bit is kept at "1".

Next, the 2nd bit from the most significant bit is set to "1", and other bits are set to "0". In this instance, the code of the 8-bit register is "64" or "192".

The reference voltage generation circuit 5# generates the reference voltage VRTL based on the register code "64" or the register code "192".

More specifically, the ¼ reference voltage, which is between the minimum reference voltage and the ½ reference voltage, is generated, or the ¾ reference voltage, which is between the maximum reference voltage and the ½ reference voltage, is generated.

Subsequently, the same operation as described above is performed.

In accordance with the reference voltage VRTL based on the register code "64" or "192", the calibration control circuit 700 instructs the multiplexer 102A to apply, to the capacitor CP0, the reference voltage VRTL that is higher than the reference voltage VR15. Further, the calibration control circuit 700 issues an instruction to the switch array 104 in order to instruct the switches SW5-SW7 to apply the reference voltage VRTL to the associated capacitors CP1-CP3.

Consequently, in accordance with the reference voltage VRTL based on the register code "64" or "192", the 128 LSB equivalent analog reference signal VAR can be generated in a pseudo manner.

The calibration control circuit 700 also controls the auto-zero switches of the S/H circuit 108. In an initial state, the auto-zero switches of the S/H circuit 108 are on.

When the 128 LSB equivalent voltage is to be sampled, the calibration control circuit 700 turns off the auto-zero switches. While a comparison is in progress, a terminal to which a signal VA coupled to the capacitor CRP of the S/H circuit 108 is inputted is coupled to a fixed voltage and made invariable.

As illustrated in FIG. 15B, the normal 128 LSB analog reference signal VAR (128 LSB voltage) is generated. More specifically, the calibration control circuit 700 instructs the multiplexer 102A to apply the reference voltage VRB to the capacitor CP0. Further, the calibration control circuit 700 issues an instruction to the switch array 104 in order to instruct the switches SW5-SW7 to apply the reference voltage VRB to the associated capacitors CP1-CP3. The calibration control circuit 700 also instructs the switch SW8 to apply the reference voltage VRT to the associated capacitor CP4.

Consequently, the 128 LSB analog reference signal VAR can be generated.

Accordingly, the comparator 110 compares the 128 LSB voltage with the previously sampled 128 LSB equivalent voltage, and outputs the output signal COMP indicative of the result of comparison.

In accordance with the output signal, the calibration control circuit 700 sets the register 60.

More specifically, when the 128 LSB equivalent voltage based on the register code "64" or "192" is compared with the 128 LSB voltage, and the output signal COMP ("H" level) indicates that 128 LSB equivalent voltage>128 LSB voltage, the 2nd bit is set to "0". Meanwhile, when the 128 LSB equivalent voltage is compared with the 128 LSB voltage, and the output signal COMP ("L" level) indicates that 128 LSB equivalent voltage 128 LSB voltage, the 2nd bit is kept at "1".

Subsequently, the lower-order bits, namely, the 3rd to 8th bits, are set by repeating the same process as described above. When the above-described method is used, the 128 LSB equivalent voltage based on the register code approximates the 128 LSB voltage.

The above-described method makes it possible to automatically correct the reference voltage VRTL to an appropriate value.

The result of comparison by the comparator 110 may be in error due to an offset caused by element variations in the S/H circuit 108 and the comparator 110.

Such error can be reduced, for example, by using the average value of the results of comparison made by the comparators in the plural columns in the solid-state imaging device.

If, for example, comparison is made by the comparators in 1000 columns, and the "H" level is outputted from 700 columns and the "L" level is outputted from 300 columns, the proportion in relation to a whole is 0.7 to 0.3. Thus, the level may be determined to be "H".

As regards the last comparison, an optimum VRTL can be selected by choosing an average value closer to 0.5.

Similarly, an offset may also be caused by charge injection or clock feedthrough when the auto-zero switches are turned off.

The offset may be caused depending whether the 128 LSB equivalent voltage or the 128 LSB voltage is inputted when the S/H circuit 108 is auto-zeroed.

When comparison is to be made by the comparators in 1000 columns, the offset can be canceled by auto-zeroing the comparators in 500 columns with the 128 LSB equivalent voltage and auto-zeroing the comparators in the remaining 500 columns with the 128 LSB voltage.

The output result generated by the comparator for the S/H circuit 108 auto-zeroed with the 128 LSB equivalent voltage has a reverse polarity from the output result generated by the comparator for the S/H circuit 108 auto-zeroed with the 128 LSB voltage. Therefore, when the average is to be calculated, one of the polarities needs to be reversed for counting purposes.

Here, as an example, the number of columns is assumed to be 1000. However, the larger the number of columns, the higher the accuracy of comparison and thus the greater the effect of offset cancellation.

The comparators and many columns used as described above are circuits inherently incorporated in the solid-state imaging device. Therefore, the above-mentioned functions can be implemented by adding only one switch for the multiplexer 530 described with reference to FIG. 14. The reference voltage VRTL can be appropriately set without increasing the power consumption or the circuit area.

Although the present disclosure has been described with reference to preferred embodiments, it is not intended that the present disclosure be limited to only those described embodiments. It is to be understood that various modifications of these embodiments will undoubtedly be made without departing from the spirit and scope of the present disclosure.

What is claimed is:

1. A solid-state imaging device comprising:
   a pixel circuit that outputs an analog pixel signal having a voltage based on the amount of incident light;
   a first reference voltage generation circuit that generates two types of first reference voltage, namely, a first reference voltage for a first voltage and a first reference voltage for a second voltage lower than the first voltage;
   a second reference voltage generation circuit that generates N types of second reference voltage based on resistance division; and
   a successive approximation A/D converter that performs A/D conversion on the analog pixel signal based on the first and second reference voltages;
   wherein the successive approximation A/D converter includes:
   a D/A converter that converts a digital reference signal to an analog reference signal;
   a comparator that compares the magnitude of the analog pixel signal with the magnitude of the analog reference signal and outputs a signal indicative of the result of comparison; and
   a successive approximation register that operates based on the result of comparison by the comparator in order to generate the digital reference signal in such a manner that the analog reference signal approximates the analog pixel signal, and
   wherein the D/A converter includes:
   a split capacitor that has one electrode coupled to an output node;
   a plurality of first capacitors that each have one electrode coupled to the output node;
   a plurality of second capacitors that are coupled to the other electrode of the split capacitor;
   a switch array that is coupled to the other electrode of each of the first and second capacitors and is adapted to generate the analog reference signal at the output node by selectively applying the first reference voltage;
   a third capacitor that has one electrode coupled to the other electrode of the split capacitor; and
   a multiplexer that is coupled to the other electrode of the third capacitor and is adapted to generate the analog reference signal at the output node by selectively applying the second reference voltage.

2. The solid-state imaging device according to claim 1, wherein the first capacitors include first to mth first capacitors,
   wherein the second capacitors include first to nth second capacitors,
   wherein the capacitance values of the first to mth first capacitors sequentially increase in twofold increments, and
   wherein the capacitance values of the first to nth second capacitors sequentially increase in twofold increments.

3. The solid-state imaging device according to claim 2, wherein the capacitance value of the third capacitor is the same as the capacitance value of the first one of the first capacitors and as the capacitance value of the first one of the second capacitors.

4. The solid-state imaging device according to claim 1, wherein the A/D conversion includes a first A/D conversion and a second A/D conversion, wherein, at the time of the first A/D conversion, the switch array selectively applies the first reference voltage to the other electrodes of the first and second capacitors, and wherein, at the time of the second A/D conversion, the multiplexer selectively applies the second reference voltage to the other electrode of the third capacitor.

5. The solid-state imaging device according to claim 1, wherein the switch array includes a plurality of selector switches that correspond to the first and second capacitors and couple either one of the first and second voltages to the other electrodes of the first and second capacitors.

6. The solid-state imaging device according to claim 1, wherein the successive approximation A/D converter further includes a sample-and-hold circuit between the D/A converter and the comparator.

7. The solid-state imaging device according to claim 6, wherein the sample-and-hold circuit includes:
a fourth capacitor that has one electrode adapted to receive a voltage input based on the analog pixel signal;
an amplifier that is coupled to the other electrode of the fourth capacitor and to the output node; and
an auto-zero switch that shorts the input and output ends of the amplifier.

8. The solid-state imaging device according to claim 7, wherein a positive terminal at the input end of the amplifier is coupled to the other electrode of the fourth capacitor, and a negative terminal at the input end is coupled to the output node, and
wherein the auto-zero switch includes:
a first switch that is disposed between a negative terminal at an output end and the positive terminal; and
a second switch that is disposed between a positive terminal at the output end and the negative terminal.

9. The solid-state imaging device according to claim 1, wherein the second reference voltage generation circuit includes a resistor ladder that generates N types of second reference voltage by dividing a voltage between the first voltage and the second voltage.

10. The solid-state imaging device according to claim 1, wherein the first reference voltage generation circuit includes a voltage follower circuit.

11. The solid-state imaging device according to claim 1, further comprising:
a third reference voltage generation circuit that generates a third reference voltage,
wherein the switch array generates the analog reference signal at the output node by selectively applying the first reference voltage or the third reference voltage to the other electrodes of the second capacitors.

12. The solid-state imaging device according to claim 11, wherein the third reference voltage generation circuit generates the third reference voltage based on the first and second voltages.

13. The solid-state imaging device according to claim 12, wherein the third reference voltage generation circuit includes:
a plurality of resistive elements;
a multiplexer that receives L types of third reference voltage based on resistance division by the resistive elements; and
a voltage follower circuit that receives the third reference voltage selectively outputted by the multiplexer.

14. The solid-state imaging device according to claim 13, further comprising:
a control circuit that controls the multiplexer.

15. The solid-state imaging device according to claim 14, further comprising:
a register having a plurality of bits,
wherein the control circuit generates a control signal that controls the multiplexer in accordance with a register value of the register.

16. The solid-state imaging device according to claim 15, further comprising:
a calibration control circuit for setting the register value of the register.

17. The solid-state imaging device according to claim 11, wherein the second reference voltage generation circuit generates N types of second reference voltage based on resistance division by the third reference voltage.

18. The solid-state imaging device according to claim 1, comprising a plurality of pieces of the pixel circuit that are disposed in rows and columns,
wherein the successive approximation A/D converter is provided for each column to perform A/D conversion on the analog pixel signal outputted from the associated pixel circuit in a selected one of the rows, and includes a signal processing circuit that is commonly provided for the successive approximation A/D converters to generate a digital pixel signal based on an output signal of each successive approximation A/D converter.

* * * * *